(12) United States Patent
Millet et al.

(10) Patent No.: US 12,135,341 B2
(45) Date of Patent: Nov. 5, 2024

(54) CURRENT TRANSDUCER

(71) Applicant: LEM International SA, Meyrin (CH)

(72) Inventors: Fabien Millet, Bons-en-Chablais (FR); Dominik Schläfli, Nyon (CH)

(73) Assignee: LEM International SA, Meyrin (CH)

( * ) Notice: Subject to any disclaimer, the term of this patent is extended or adjusted under 35 U.S.C. 154(b) by 120 days.

(21) Appl. No.: 17/915,614

(22) PCT Filed: Mar. 24, 2021

(86) PCT No.: PCT/EP2021/057616
§ 371 (c)(1),
(2) Date: Sep. 29, 2022

(87) PCT Pub. No.: WO2021/197970
PCT Pub. Date: Oct. 7, 2021

(65) Prior Publication Data
US 2023/0132919 A1    May 4, 2023

(30) Foreign Application Priority Data
Mar. 31, 2020   (EP) .................................... 20166923

(51) Int. Cl.
*G01R 15/20* (2006.01)
*G01R 1/30* (2006.01)
*G01R 33/02* (2006.01)

(52) U.S. Cl.
CPC ............... *G01R 15/207* (2013.01); *G01R 1/30* (2013.01); *G01R 33/02* (2013.01)

(58) Field of Classification Search
CPC ........ G01R 15/00; G01R 15/14; G01R 15/20; G01R 15/207; G01R 1/00; G01R 1/30; G01R 33/00; G01R 33/0023; G01R 33/02
(Continued)

(56) References Cited

U.S. PATENT DOCUMENTS 5,461,353 A    10/1995   Eberhardt
6,366,076 B1    4/2002   Karrer
(Continued)

FOREIGN PATENT DOCUMENTS

EP    1965217    9/2008

OTHER PUBLICATIONS

Basic Electronics Tutorials, "Active Low Pass Filter", EE Times, Date (undisclosed).*
(Continued)

*Primary Examiner* — Hoai-An D. Nguyen
(74) *Attorney, Agent, or Firm* — Faegre Drinker Biddle & Reath LLP

(57) ABSTRACT

An open-loop electrical current transducer for measuring an electrical current flowing in a primary conductor, includes a magnetic circuit core with an air-gap, and a magnetic field sensing device positioned at least partially in the air-gap, the magnetic field sensing device including a circuit board, a first magnetic field detector in the form of an ASIC mounted on the circuit board, and a second magnetic field detector in the form of a conductive pick-up coil formed on two or more layers in or on the circuit board. The outputs of the first and second magnetic field detectors are connected to a signal processing circuit generating an output signal representative of the electrical current, the output of the ASIC representing a low frequency (LF) channel and the output of the pick-up coil representing a high frequency (HF) channel.

20 Claims, 4 Drawing Sheets

(58) Field of Classification Search
USPC .............................................. 324/76.11, 126
See application file for complete search history.

(56) References Cited

U.S. PATENT DOCUMENTS

| | | | | |
|---|---|---|---|---|
| 7,977,934 | B2* | 7/2011 | Lepine | G01R 15/207 |
| | | | | 324/117 R |
| 9,291,648 | B2* | 3/2016 | Snoeij | G01R 19/0092 |
| 11,650,229 | B2* | 5/2023 | Trombert | G01R 33/04 |
| | | | | 324/253 |
| 2009/0167301 | A1 | 7/2009 | Ausserlechner | |
| 2014/0253108 | A1 | 9/2014 | Singh | |
| 2015/0219692 | A1 | 8/2015 | Krah | |

OTHER PUBLICATIONS

International Search Report and Written Opinion as issued by the International Searching Authority, dated May 26, 2021, for International Patent Application No. PCT/EP2021/057616; 13 pages.

* cited by examiner

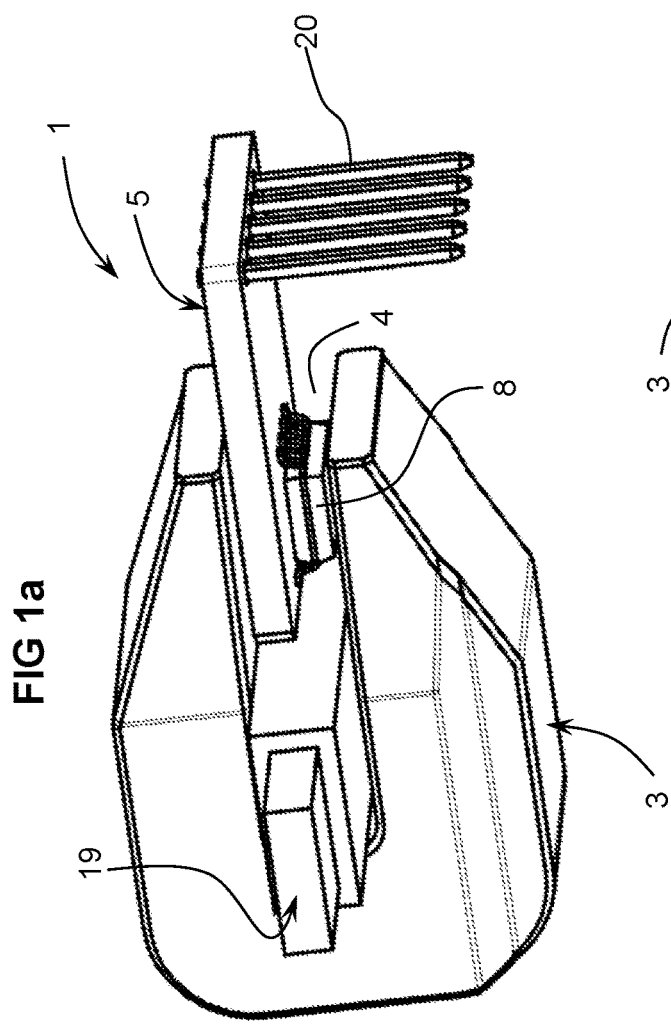
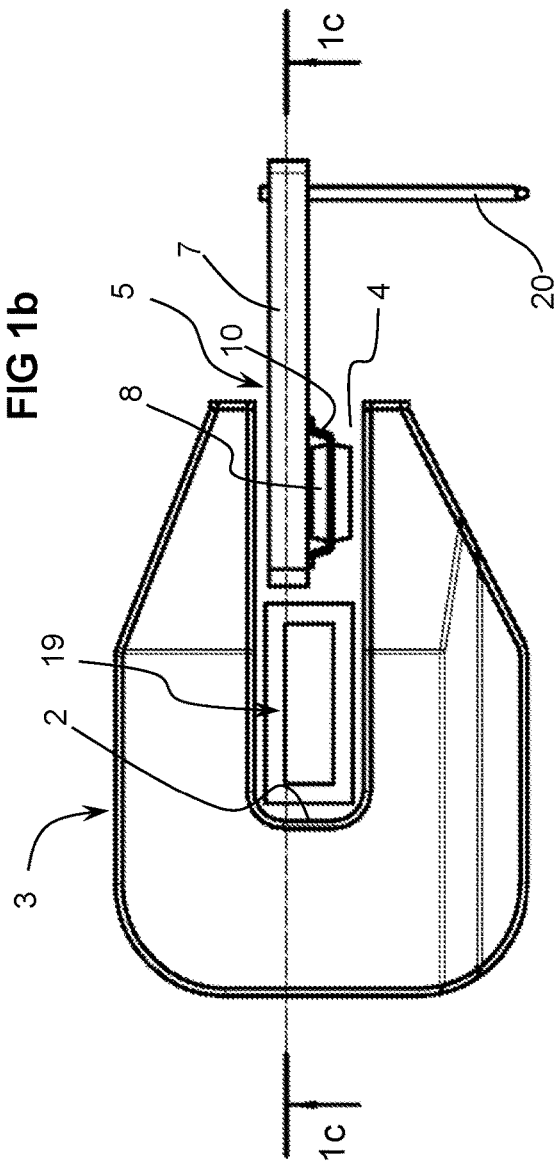

CURRENT TRANSDUCER

CROSS-REFERENCE TO RELATED APPLICATIONS

The present application is a national stage entry of International (PCT) Patent Application Number PCT/EP2021/057616, filed Mar. 24, 2021, which claims priority to European Patent Application Number 20166923.1, filed Mar. 31, 2020, the complete disclosures of which are expressly incorporated herein by reference.

The present invention relates to an open-loop current transducer for measurement of currents over a high frequency range.

Wide Band Gap semiconductors have opened the possibility of significantly faster switching frequencies and steeper transitions between states, resulting in switched currents with higher di/dt, and switched voltages with higher dv/dt. Many applications use current measurement as an input to their control loops, and in order to implement advanced control schemes, fast and accurate current measurement is required, resulting in bandwidth requirements that are 1 to 2 orders of magnitude higher than in previous generations of current transducers (100 kHz→5 MHz).

Open-loop current transducers are widely used for measuring electrical current flowing in a primary conductor. Such sensors typically comprise a magnetic core surrounding the primary conductor, comprising an air-gap in which a magnetic field detector is positioned. The magnetic field detector may typically be a Hall effect sensor or a magnetoresistive magnetic field sensor. Hall sensors however have a limited bandwidth. Magnetoresistive sensors may have a high bandwidth, but they have a limited offset stability as well as 1/f noise and they also suffer from perming and hysteresis.

It is known to have current transducers without magnetic cores, which are advantageous for measuring large currents, but for lower currents the magnetic signal is small and such transducers are thus less advantageous for applications requiring accurate current measurement over large current ranges than current sensors with a gapped magnetic core.

An open loop transducer for high bandwidth and high current range measurement as described in EP1965217 combines the high frequency measurement capability of a planar pick-up coil with a Hall sensor. The pick-up coil is realized as circuit tracks on a PCB, series connected to the output of an amplifier connected to the Hall sensor. A drawback of this known transducer is that the crossover frequency at which the coil starts to contribute is about an order of magnitude lower than the natural roll-off of the Hall sensor unit which results in a large deviation from an ideal flat frequency response over a large current measurement range.

Other conventional current sensors with large operating frequency bandwidths typically have the drawback of being limited in the amplitude range of measurement with the desired precision. Moreover, response times of conventional open loop current sensors with large operating frequency bandwidths are typically more than 2 µs ($2\times10^{-6}$ seconds), which may be too slow for certain applications.

In view of the aforegoing, an object of this invention is to provide an open-loop current transducer having a wide frequency bandwidth for measuring currents with a short response time, and a large amplitude range that has a high offset stability and a frequency response with a low deviation from an ideal flat frequency response over the measurement range.

A wide frequency bandwidth may in particular be from 0 (DC) to about 1-5 MHz. A large current amplitude range may be about from 0A to a maximum in a range of 50 A to 300 A.

It is advantageous to provide a current transducer that is compact and economical to manufacture.

It is advantageous to provide a current transducer that is compact and that employs simple signal processing circuits.

It is further advantageous to provide a current transducer that has a low power consumption, in particular for use in relation to autonomous devices.

Objects of the invention have been achieved by providing an open loop current transducer according to claim 1.

Disclosed herein is An open-loop electrical current transducer for measuring an electrical current flowing in a primary conductor, comprising a magnetic circuit core with an air-gap, and a magnetic field sensing device comprising a circuit board, a first magnetic field detector in the form of an ASIC mounted on the circuit board, and a second magnetic field detector (in the form of a conductive pick-up coil formed on two or more layers in or on the circuit board beneath the ASIC and in overlapping relationship therewith, the ASIC and pick-up coil positioned in said air-gap. The outputs of the first and second magnetic field detectors are connected to a signal processing circuit generating an output signal representative of said electrical current, the output of the ASIC representing a low frequency (LF) channel and the output of the pick-up coil representing a high frequency (HF) channel. The signal processing circuit comprises an adding circuit configured to sum a signal output by the LF channel with a signal output by the HF channel, and one or more circuit components including at least a gain adjust resistor (Rac) connected in series to the output of the pick-up coil to adjust a gain of the output signal of the pick-up coil to a gain of the output signal of the ASIC.

In an advantageous embodiment, the adding circuit comprises an operational amplifier, a resistance connected across the operational amplifier between a negative input and an output of operational amplifier and a capacitance connected across the operational amplifier between a negative input and an output of operational amplifier, thus forming an inverting summing circuit with low pass filtering.

The transducer according to embodiments of the invention advantageously allows measurement of a primary current over a bandwidth from DC to several MHz, with frequency response flatness better than ±1 dB, and a highly stable offset, typically less than 0.1% of full scale. In addition, the open loop response time achievable with a transducer according to embodiments of the invention may be about or less than 10 ns ($10\times10^{-9}$ seconds).

The transducer according to embodiments of the invention also advantageously has a good signal to noise ratio (SNR) since output noise from the ASIC is filtered by the low pass filter of the operational amplifier circuit.

In an advantageous embodiment, a positive input of the operational amplifier is connected to a reference Voltage source of the signal processing circuit.

In an advantageous embodiment, the positive input of the operational amplifier is further connected to an external voltage reference connection via a resistor.

In an advantageous embodiment, the reference Voltage source is connected to the positive input of the operational amplifier via a series resistance and parallel capacitance configured to adapt the impedance and reduce noise on the Voltage reference input.

In an advantageous embodiment, the gain adjust resistor is adjustable: by laser trimming of said gain adjust resistor;

by providing said gain adjust resistor as a programmable resistor realized on an integrated circuit; or by adding or removing one or more additional resistors connected in parallel to said gain adjust resistor.

In an advantageous embodiment, the signal processing circuit comprises a capacitance connected in series to the output of the pick-up coil.

In an advantageous embodiment, the magnetic field sensing device comprises electrostatic screens connected to ground and arranged on both sides of the pick-up coil and overlapping the pick-up coils configured to reduce capacitive coupling between the primary conductor and the pick-up coil, the electrostatic screens comprising each a plurality of conductive circuit traces on the circuit board separated by non-conductive gaps configured to reduce eddy currents.

In an advantageous embodiment, the pick-up coil comprises at least two coil portions on different layers embedded within the circuit board substrate and connected together in series by a conductive connection path through the layers.

In an advantageous embodiment, the electrostatic screens are formed on opposed outer sides of the circuit board.

Further objects and advantageous features of the invention will be apparent from the claims, from the detailed description, and annexed drawings, in which:

FIG. 1a is a perspective view of a portion of a current transducer (housing removed) according to an embodiment of the invention;

FIG. 1b is a side view of the portion of current transducer of FIG. 1a;

Figure 1C:
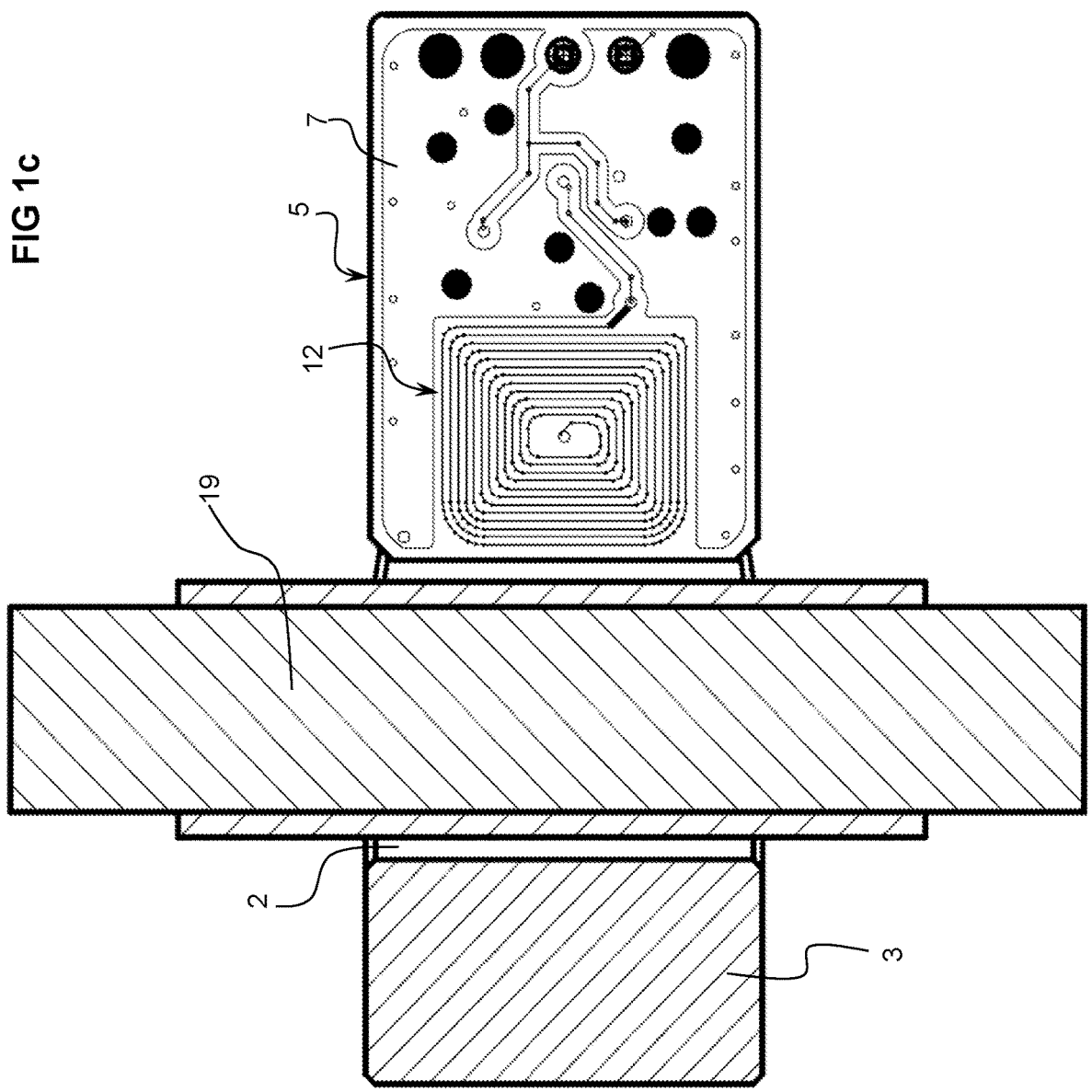
FIG. 1c is a cross-sectional view through line 1c-1c of FIG. 1b.
Figure 2:
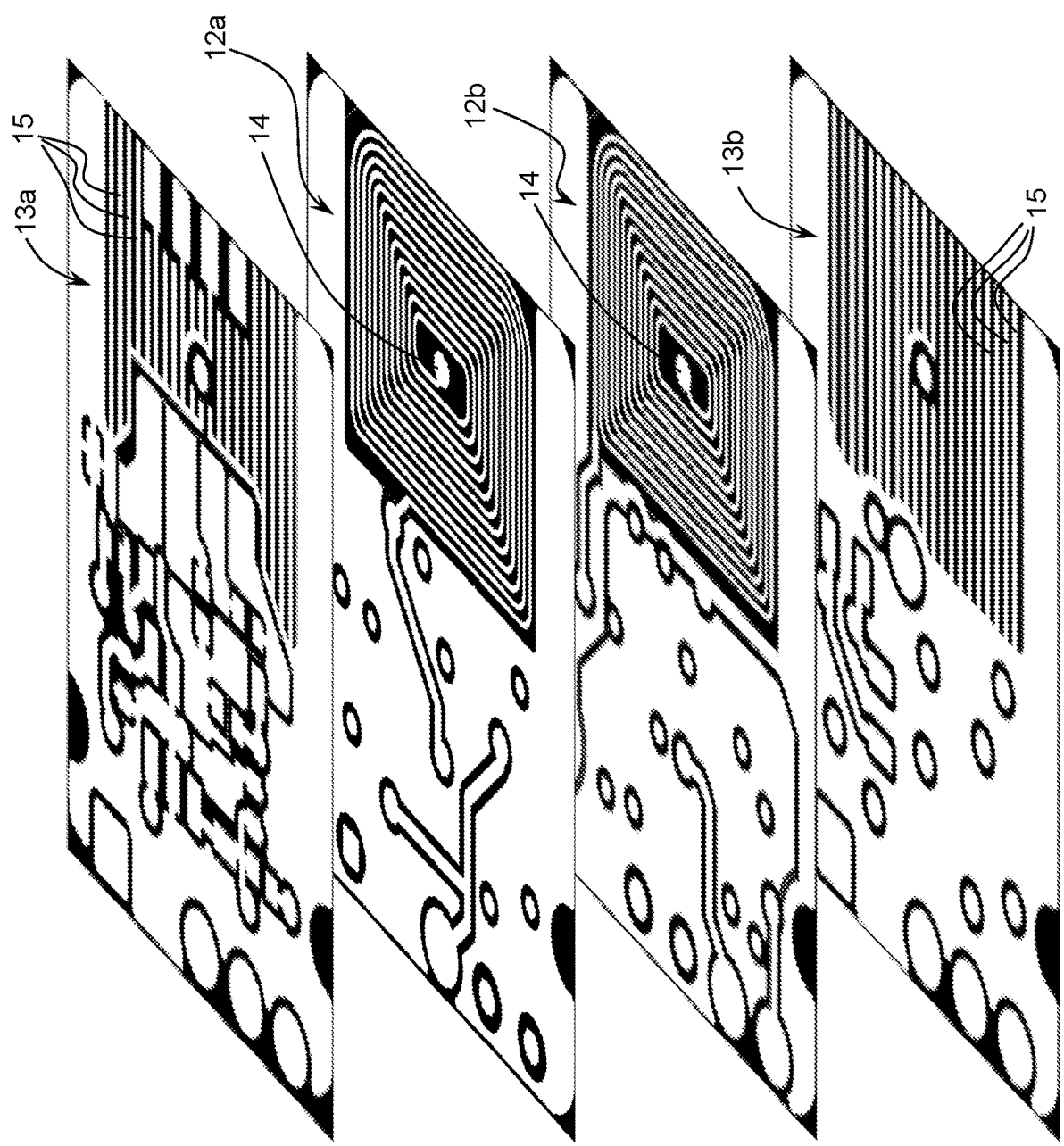
FIG. 2 is a schematic perspective view of a pick-up coil of a current transducer according to an embodiment of the invention.
Figure 3:
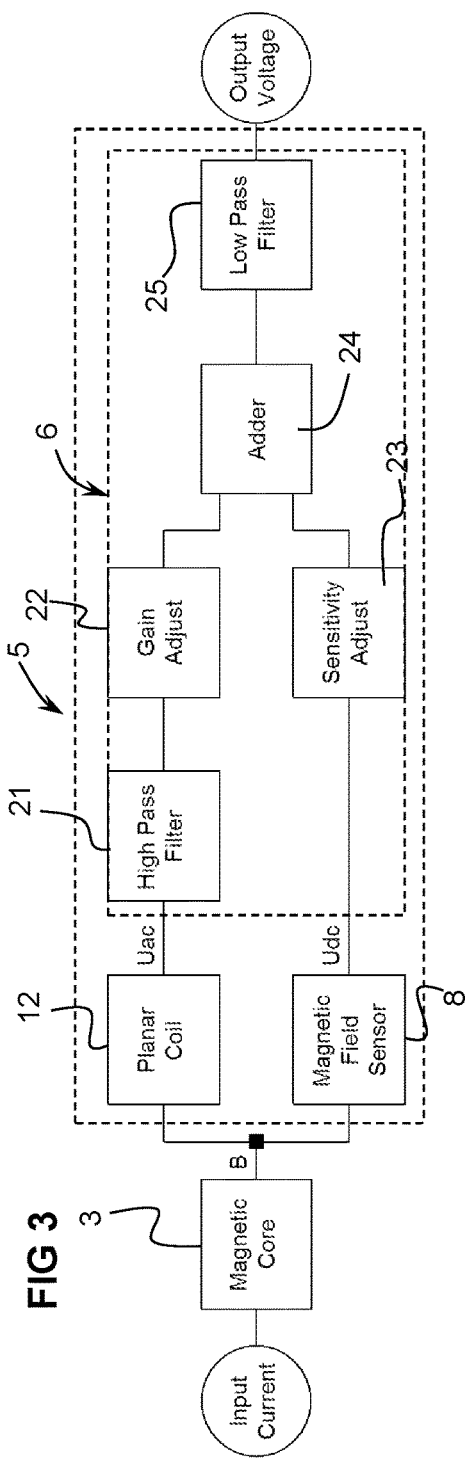
FIG. 3 is a block diagram of a signal processing circuit of a current transducer according to an embodiment of the invention.

Referring to the figures, an electrical current transducer 1 for measuring the current flowing in a primary conductor 19 traversing a central aperture 2 of the transducer, comprises a magnetic circuit 3 with an air-gap 4, and a magnetic field sensing device 5 positioned at least partially in the air-gap. The magnetic circuit 3 may be made of a stack of laminations, or of a solid core, of different shapes and sizes and of different magnetically conducting materials, as is known in the art. The magnetic circuit may also be split in two parts to allow assembly of the sensor around a primary conductor, as is known in the art. Further, a portion of the primary conductor 19 may be integrated into the sensor and have terminals for connection to a primary conductor, as is known in the art.

In a preferred embodiment, the magnetic core is made of a ferrite material in order to better support high frequency primary currents compared to soft iron cores.

The current sensor may be provided with a second air-gap and a second magnetic field sensing device positioned at least partially in said second air-gap.

The magnetic field sensing device comprises a circuit board 7, a first magnetic field detector 8 mounted on the circuit board, a second magnetic field detector 12 and a signal processing circuit 6.

The signal processing circuit 6 is provided on the circuit board 7 and is connected to the magnetic field detectors 8,12.

Connection terminals 20 connected to the circuit board allow connection to external circuitry (not shown) of a device (e.g. an electrical motor) in which the transducer is implemented for measurement of a primary current (e.g. a phase current of the electrical motor), typically to control a function of the device (e.g. the operation of the motor).

The first magnetic field detector 8 is, in a preferred embodiment, in the form of a Hall effect sensor included in an integrated circuit (ASIC) with connection terminals 10 connected, for example by soldering, to circuit traces on the circuit board 7. The first magnetic field detector may however also comprise other types of known magnetic field sensors such as a magneto-resistive magnetic field sensor, or a fluxgate magnetic field sensor. In the preferred embodiment, the Hall effect sensor may be operated using per se known current spinning techniques to reduce offset and 1/f noise.

The second magnetic field detector 12 of the magnetic sensing device, comprises a conductive coil comprising at least two coil portions 12a, 12b formed by circuit traces on different layers on or within the circuit board. The coil portions may be connected together in series to form a single pick-up coil. The coil portions may be connected together by means of a conductive plated through-hole 14 or an interconnection pin or path through the board to interconnect the coil portions. The coil can thus be formed on the circuit board by means of conventional technology for producing conductive tracks on circuit boards, thus benefiting from the presence of the circuit board for connection of the first magnetic field detector and for the signal processing or preprocessing circuit 6. The coil is preferably connected to a reference voltage VREF of the ASIC instead of to ground to reduce noise on the output is of the coil.

The circuit board may advantageously further comprise electrostatic screens 13a, 13b on top and bottom layers such that the pick-up coil 12 is sandwiched between the electrostatic screens that form electrical shielding layers around the pick-up coil. The shielding layers reduce capacitive coupling between the pick-up coil 12a, 12b and the primary conductor 19 directly or via the magnetic core 3. This provides protection against electrical disturbances, in particular generated by primary currents with high rates of voltage change (high dV/dt). The electrostatic screens may be formed on the circuit board by means of conventional technology for producing conductive tracks on circuit boards and may be connected to ground or another reference voltage connection. The electrostatic screens may be formed on opposed outer surfaces of the circuit board, and the pick-up coil on inner embedded layers, however the electrostatic screens may also be arranged on layers embedded within the circuit board substrate. The electrostatic screens may advantageously have a comb structure with a plurality of conductive tracks separated by non-conductive tracks in order to reduce eddy currents from forming in the shield layer. The conductive tracks are electrically interconnected together preferably only at one end of the tracks to prevent eddy currents circulating in loops that would otherwise be formed by the tracks if they were connected together at both extremities.

The multi-layer pick-up coil has an increased gain over a single layer coil and advantageously allows to reduce the cut off frequency of the low pass filter to obtain a low noise output for the signal from the pick-up coil.

The signal processing circuit 6 according to an embodiment of the invention comprises circuitry to combine the output signal from the first magnetic field detector 8 representing a low frequency (LF) channel and the output signal from the pick-up coil 12 representing a high frequency (HF) channel. The two output signals are advantageously combined by summing the LF and HF output signals using an adding circuit 24 that may advantageously comprise a low pass filter 25.

In a preferred embodiment, the adding circuit 24 with low pass filter 25 comprises an operational amplifier 26 and a resistance R1 and a capacitance C1 connected across the operational amplifier between a first input (the negative input) and an output of operational amplifier, thus forming an inverting summing circuit with low pass filtering. The operational amplifier 26, resistance R1 and capacitance C1 forms an active first order low pass filter. The second input (the positive input) of the operational amplifier is connected to a reference Voltage.

The reference Voltage input may be connected to a reference Voltage source VREF of the signal processing circuit (e.g. a 2.5V voltage source), optionally via a series resistance Rr2 and parallel capacitance Cr, to adapt the impedance and reduce noise. The level of the input reference Voltage may optionally be adjusted by an external connection VREF_IN connected to the second input of the operational amplifier via a resistor Rr1. The latter allows a user of the current transducer to adapt the voltage level of the transducer output measurement signal Uout to user requirements, in particular the requirements of the external circuitry to which the transducer is connected via the connection terminals 20. This would allow for instance the user to change the voltage level of the output measurement signal such that it remains a positive current over the full measurement range of the transducer, which in many applications is convenient for the control of a device.

The gain of the first magnetic field sensor included in an ASIC may be adjusted by a resistor Rdc connected to the ASIC output OUT and/or by adjusting registers in the integrated circuit of the ASIC to set the current output level of the ASIC.

In the HF channel connected to the pick-up coil 12, a high pass filter 21 may be formed by a capacitance Cac that removes any DC or low frequency signal, preferably signals with a frequency below 10 Hz. The capacitance Cac helps to reduce gain at direct current (DC) or low frequencies for the HF path and avoid amplifying the operational amplifier offset. The pick-up coil gain may advantageously be adjusted to match the gain of the LF channel such that the summing of the two signals has a frequency response that is close to an ideal flat frequency response, preferably better than +/−1 dB while benefitting from a highly stable offset. The stable offset comes from the combination of providing a Hall effect sensor in an ASIC driven with a high frequency current spinning technique but operating at low frequency primary current measurement, and on the other hand providing a multilayer pick up coil formed on the circuit board (thus allowing to have a larger magnetic field pick-up surface area than the ASIC) operating at higher frequencies, the pick-up coil inherently having no offset drift. Compared to a series connection as found in the prior art, the summing of the signals according to the invention allows to flatten the frequency response, whereas in a series connection the crossover frequency at which the coil starts to contribute is about an order of magnitude lower than the natural roll-off of the Hall sensor unit which results in a large deviation from an ideal flat frequency response over a large current measurement range.

The gain adjustment of the HF channel may advantageously be effected by a resistor Rac connected in series to the output of the pick-up coil. The resistance value of the HF channel gain adjust resistor Rac may adjusted by various means, including: by laser trimming of the resistor Rac; by providing Rac as a programmable resistor realized on an integrated circuit; or by adding or removing one or more additional resistors connected in parallel to Rac.

The LF channel may further comprise a sensitivity adjust component 23, for instance to allow calibration of the transducer such as to compensate for variations in the length of the magnetic gap 4. This sensitivity adjust component may be effected as a programmable element in the ASIC to adjust the output level OUT or by using a programmable gain amplifier (PGA) (not shown) at the output of the ASIC.

Figure 4:
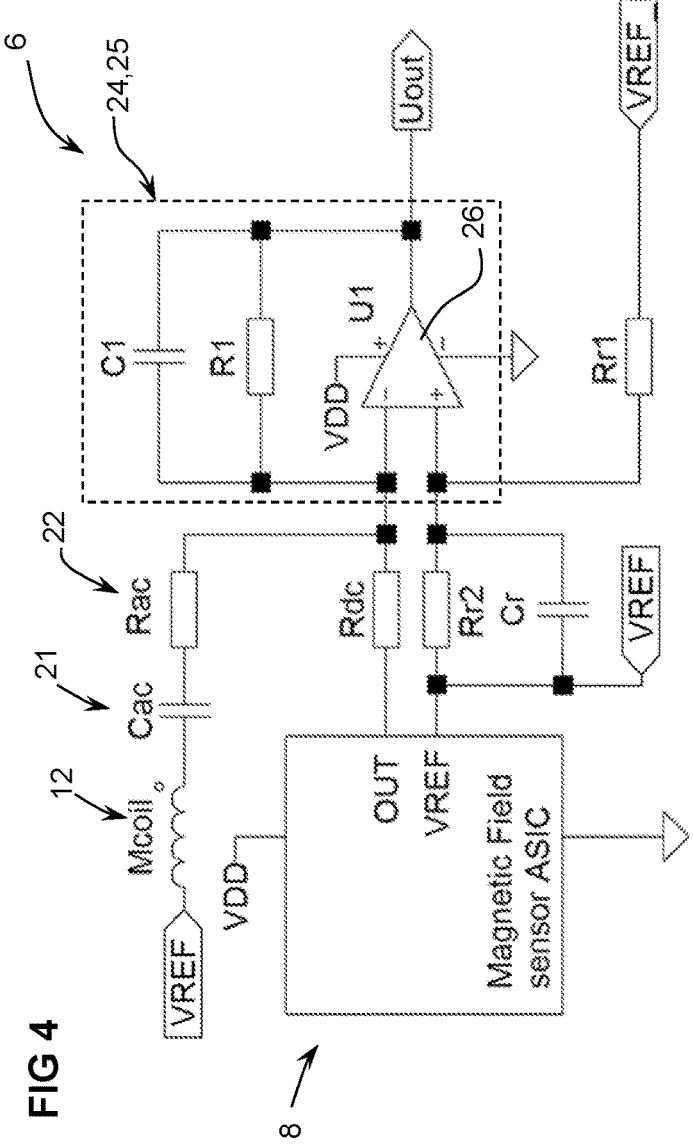
FIG. 4 is a circuit diagram of a signal processing circuit of a current transducer according to an embodiment of the invention.

Features of the working principle of the illustrated embodiment of FIG. 4 are further described below:

LF path: below the crossover frequency defined by the time constant R1×C1 the operational amplifier circuit amplifies the ASIC output voltage by a factor R1/Rdc. If there were no other components, the circuit would be a simple active first order lowpass, its corner frequency being the one mentioned above.

HF path: the idealized output voltage of the pick-up coil rises proportional with the frequency of the current to be measured, its phase leads by 90°. In the frequency range where the signal is to be used as an image of the primary current, it should pass through an integrator. This is the function of the illustrated circuit for frequencies higher than the crossover frequency where the pick-up coil voltage is higher than the ASIC output voltage. In order to obtain a smooth transition between the two frequency ranges, the HF gain should be adjusted so that at the crossover frequency the output voltage of the pick-up coil has the same amplitude as the one from the ASIC. In practice (due to parasitic elements not shown in the circuit diagram, non-linearities etc.) a slightly better response in the time domain may be obtained by adjusting the HF gain slightly higher than the LF gain.

Preferable Values of the Components:

The capacitance Cac should have a high capacitance value, preferably between 5-20 µF, for instance around 10 µF for a good price/performance compromise.

Values of the Resistance R1, and Capacitance C1:

The lower the cut off frequency, the lower will be the output noise (there is a limit given by the practical size of the pick-up coil, small pick-up coils with few turns supply high enough voltages at higher frequency).

C1: capacitances between 1 nF and 10 nF are preferably used;

R1: resistance values may vary between 30 kΩ to 200 kΩ depending on the desired gain; Crossover frequencies around 1 kHz are preferable; for a given crossover frequency an increasing C1 improves the dv/dt perturbation effects (from 1 nF to 10 nF by a factor of 10).

However with an increasing value of the capacitance C1, the gain adjust resistance Rac needs to be decreased in order to keep the crossover frequency at a desired value, for instance 1 kHz, and the performance on di/dt is degraded, so a compromise needs to be found depending on the desired transducer sensitivity.

The gain adjust resistance Rac should preferably be higher than 1 kΩ, better if higher (from 1 kΩ to 30 kΩ; depending on the transducer gain).

Non-limitative but advantageous of examples of approximate values for other component values could for instance include:

Rdc=R1
Rr2=R1/2
Rr1=R1
Cr⇒about 10 μF (as big as possible)

The invention claimed is:

1. An open-loop electrical current transducer for measuring an electrical current flowing in a primary conductor, comprising a magnetic circuit core with an air-gap, and a magnetic field sensing device comprising a circuit board, a first magnetic field detector in the form of an ASIC mounted on the circuit board, and a second magnetic field detector in the form of a conductive pick-up coil formed on two or more layers in or on the circuit board beneath the ASIC and in overlapping relationship therewith, the ASIC and pick-up coil positioned in said air-gap, the outputs of the first and second magnetic field detectors connected to a signal processing circuit generating an output signal representative of said electrical current, the output of the ASIC representing a low frequency (LF) channel and the output of the pick-up coil representing a high frequency (HF) channel, wherein the signal processing circuit comprises an adding circuit configured to sum a signal output by the LF channel with a signal output by the HF channel, and one or more circuit components including at least a gain adjust resistor (Rac) connected in series to the output of the pick-up coil to adjust a gain of the output signal of the pick-up coil to a gain of the output signal of the ASIC.

2. The transducer according to claim 1, wherein the adding circuit comprises an operational amplifier, a resistance (R1) connected across the operational amplifier between a negative input and an output of operational amplifier and a capacitance (C1) connected across the operational amplifier between a negative input and an output of operational amplifier.

3. The transducer according to claim 2, wherein a positive input of the operational amplifier is connected to a reference Voltage source (VREF) of the signal processing circuit.

4. The transducer according to claim 1, wherein said gain adjust resistor (Rac) is adjustable: by laser trimming of said gain adjust resistor Rac; by providing said gain adjust resistor as a programmable resistor realized on an integrated circuit; or by adding or removing one or more additional resistors connected in parallel to said gain adjust resistor.

5. The transducer according to claim 1, the signal processing circuit comprises a capacitance (Cac) connected in series to the output of the pick-up coil.

6. The transducer according to claim 1, wherein the magnetic field sensing device comprises electrostatic screens connected to ground and arranged on both sides of the pick-up coil and overlapping the pick-up coils configured to reduce capacitive coupling between the primary conductor and the pick-up coil, the electrostatic screens comprising each a plurality of conductive circuit traces on the circuit board separated by non-conductive gaps configured to reduce eddy currents.

7. The transducer according to claim 6, wherein the pick-up coil comprises at least two coil portions on different layers embedded within the circuit board substrate and connected together in series by a conductive connection path through the layers.

8. The transducer according to claim 7, wherein the electrostatic screens are formed on opposed outer sides of the circuit board.

9. An open-loop electrical current transducer for measuring an electrical current flowing in a primary conductor, comprising a magnetic circuit core with an air-gap, and a magnetic field sensing device comprising a circuit board, a first magnetic field detector in the form of an ASIC mounted on the circuit board, and a second magnetic field detector in the form of a conductive pick-up coil formed on two or more layers in or on the circuit board beneath the ASIC and in overlapping relationship therewith, the ASIC and pick-up coil positioned in said air-gap, the outputs of the first and second magnetic field detectors connected to a signal processing circuit generating an output signal representative of said electrical current, the output of the ASIC representing a low frequency (LF) channel and the output of the pick-up coil representing a high frequency (HF) channel, wherein the signal processing circuit comprises an adding circuit configured to sum a signal output by the LF channel with a signal output by the HF channel, and one or more circuit components including at least a gain adjust resistor (Rac) connected in series to the output of the pick-up coil to adjust a gain of the output signal of the pick-up coil to a gain of the output signal of the ASIC, wherein the adding circuit comprises an operational amplifier, a resistance (R1) connected across the operational amplifier between a negative input and an output of operational amplifier and a capacitance (C1) connected across the operational amplifier between a negative input and an output of operational amplifier, wherein a positive input of the operational amplifier is connected to a reference Voltage source (VREF) of the signal processing circuit, and wherein the positive input of the operational amplifier is further connected to an external connection (VREF_IN) via a resistor (Rr1).

10. The transducer according to claim 9, wherein said gain adjust resistor (Rac) is adjustable: by laser trimming of said gain adjust resistor Rac; by providing said gain adjust resistor as a programmable resistor realized on an integrated circuit; or by adding or removing one or more additional resistors connected in parallel to said gain adjust resistor.

11. The transducer according to claim 9, the signal processing circuit comprises a capacitance (Cac) connected in series to the output of the pick-up coil.

12. The transducer according to claim 9, wherein the magnetic field sensing device comprises electrostatic screens connected to ground and arranged on both sides of the pick-up coil and overlapping the pick-up coils configured to reduce capacitive coupling between the primary conductor and the pick-up coil, the electrostatic screens comprising each a plurality of conductive circuit traces on the circuit board separated by non-conductive gaps configured to reduce eddy currents.

13. The transducer according to claim 12, wherein the pick-up coil comprises at least two coil portions on different layers embedded within the circuit board substrate and connected together in series by a conductive connection path through the layers.

14. The transducer according to claim 13, wherein the electrostatic screens are formed on opposed outer sides of the circuit board.

15. An open-loop electrical current transducer for measuring an electrical current flowing in a primary conductor, comprising a magnetic circuit core with an air-gap, and a magnetic field sensing device comprising a circuit board, a first magnetic field detector in the form of an ASIC mounted on the circuit board, and a second magnetic field detector in the form of a conductive pick-up coil formed on two or more layers in or on the circuit board beneath the ASIC and in overlapping relationship therewith, the ASIC and pick-up coil positioned in said air-gap, the outputs of the first and second magnetic field detectors connected to a signal processing circuit generating an output signal representative of said electrical current, the output of the ASIC representing a low frequency (LF) channel and the output of the pick-up coil representing a high frequency (HF) channel, wherein the signal processing circuit comprises an adding circuit configured to sum a signal output by the LF channel with a signal output by the HF channel, and one or more circuit components including at least a gain adjust resistor (Rac) connected in series to the output of the pick-up coil to adjust a gain of the output signal of the pick-up coil to a gain of the output signal of the ASIC, wherein the adding circuit comprises an operational amplifier, a resistance (R1) connected across the operational amplifier between a negative input and an output of operational amplifier and a capacitance (C1) connected across the operational amplifier between a negative input and an output of operational amplifier, wherein a positive input of the operational amplifier is connected to a reference Voltage source (VREF) of the signal processing circuit, and wherein the reference Voltage source (VREF) is connected to the positive input of the operational amplifier via a series resistance (Rr2) and parallel capacitance (Cr) configured to adapt the impedance and reduce noise on the Voltage reference input.

16. The transducer according to claim 15, wherein said gain adjust resistor (Rac) is adjustable: by laser trimming of said gain adjust resistor Rac; by providing said gain adjust resistor as a programmable resistor realized on an integrated circuit; or by adding or removing one or more additional resistors connected in parallel to said gain adjust resistor.

17. The transducer according to claim 15, the signal processing circuit comprises a capacitance (Cac) connected in series to the output of the pick-up coil.

18. The transducer according to claim 15, wherein the magnetic field sensing device comprises electrostatic screens connected to ground and arranged on both sides of the pick-up coil and overlapping the pick-up coils configured to reduce capacitive coupling between the primary conductor and the pick-up coil, the electrostatic screens comprising each a plurality of conductive circuit traces on the circuit board separated by non-conductive gaps configured to reduce eddy currents.

19. The transducer according to claim 18, wherein the pick-up coil comprises at least two coil portions on different layers embedded within the circuit board substrate and connected together in series by a conductive connection path through the layers.

20. The transducer according to claim 19, wherein the electrostatic screens are formed on opposed outer sides of the circuit board.

* * * * *